United States Patent
Chi

(10) Patent No.: US 9,164,147 B2
(45) Date of Patent: Oct. 20, 2015

(54) METHOD AND APPARATUS FOR 3D IC TEST

(75) Inventor: Shyh-An Chi, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 1105 days.

(21) Appl. No.: 13/161,610

(22) Filed: Jun. 16, 2011

(65) Prior Publication Data
US 2012/0319717 A1 Dec. 20, 2012

(51) Int. Cl.
- *G01R 31/00* (2006.01)
- *G01R 31/3185* (2006.01)
- *G01R 31/317* (2006.01)
- *G01R 31/28* (2006.01)

(52) U.S. Cl.
CPC .. *G01R 31/318513* (2013.01); *G01R 31/31717* (2013.01); *G01R 31/2886* (2013.01)

(58) Field of Classification Search
CPC ............. H01L 2224/0392; H01L 2224/32145; H01L 2224/48227; H01L 2225/0651; H01L 2225/06596; H01L 25/0657; G01R 31/2884; G01R 31/2889
USPC ........................ 324/756.05, 756.07, 415, 71.5
See application file for complete search history.

(56) References Cited

U.S. PATENT DOCUMENTS

| 7,236,757 B2* | 6/2007 | Raghavan et al. ............ 455/203 |
| 7,522,538 B2 | 4/2009 | Rhim et al. |
| 7,826,460 B2* | 11/2010 | Lee ........................... 370/395.62 |
| 8,046,727 B2* | 10/2011 | Solomon ....................... 716/116 |
| 8,386,690 B2* | 2/2013 | Li et al. .......................... 710/316 |
| 8,621,125 B2* | 12/2013 | Clark ............................. 710/105 |
| 8,832,511 B2* | 9/2014 | Chen et al. ..................... 714/733 |
| 2003/0219026 A1* | 11/2003 | Sun et al. ........................ 370/412 |
| 2004/0019733 A1* | 1/2004 | Garinger et al. ............... 710/314 |
| 2005/0058128 A1* | 3/2005 | Carson et al. .................. 370/388 |
| 2007/0079036 A1* | 4/2007 | Mukherjee .................... 710/119 |
| 2007/0081410 A1* | 4/2007 | Bernstein et al. ........ 365/230.03 |
| 2008/0068039 A1* | 3/2008 | Bernstein et al. ............... 326/16 |
| 2009/0210600 A1* | 8/2009 | Jeddeloh ....................... 710/305 |
| 2010/0332177 A1 | 12/2010 | Wu et al. |
| 2011/0010525 A1* | 1/2011 | Binkert et al. .................. 712/29 |
| 2011/0012633 A1* | 1/2011 | Rahman et al. .......... 324/754.07 |
| 2012/0146177 A1* | 6/2012 | Choi et al. ..................... 257/528 |
| 2012/0147567 A1* | 6/2012 | Lee et al. ....................... 361/729 |

OTHER PUBLICATIONS

Sharma et al., Design of 3D Integrated Circuits and Systems, CRC Press, Nov. 2014, Chapter 6-All.*
Hoshi et al., Testing of Switch Blocks in Three-Dimensional FPGA, IEEE, 2009, 24th IEEE International Symposium on Defect and Fault Tolerance in VLSI System, pp. 1-9.*

(Continued)

*Primary Examiner* — Patrick Assouad
*Assistant Examiner* — Sean Curtis
(74) *Attorney, Agent, or Firm* — Duane Morris LLP; Steven E. Koffs

(57) ABSTRACT

An apparatus comprises a die comprising a plurality of switch/router circuits; and a plurality of additional dies. Each respective one of the plurality of additional dies comprises: a respective network interface, which is electrically coupled to a respective one of the plurality of switch/router circuits; and a respective interconnection test logic, which is electrically coupled to the respective network interface and the interconnection test logic in at least one other one of the plurality of additional dies.

20 Claims, 13 Drawing Sheets

(56) References Cited

OTHER PUBLICATIONS

"IEEE Standard Test Access Port and Boundary-Scan Architecture", IEEE Std 1149.1™ -2001 (R2008), (Revision of IEEE Std 1149. Jan. 1990), The Institute of Electrical and Electronics Engineers, Inc., New York, NY, 2001, 208 pages.

"Design for Test", from Wikipedia, 2011, 4 pages, http://en.wikipedia.org/wiki/Design_for_test.

"IEEE Standard Testability Method for Embedded Core-based Integrated Circuits", IEEE Std 1500™ -2005, IEEE Computer Society, Sponsored by the Test Technology Technical Council, The Institute of Electrical and Electronics Engineers, Inc., New York, NY, 127 pages.

"Scan Chain", from Wikipedia, 2011, 1 page, http://en.wikipedia.org/wiki/Scan_chain.

* cited by examiner

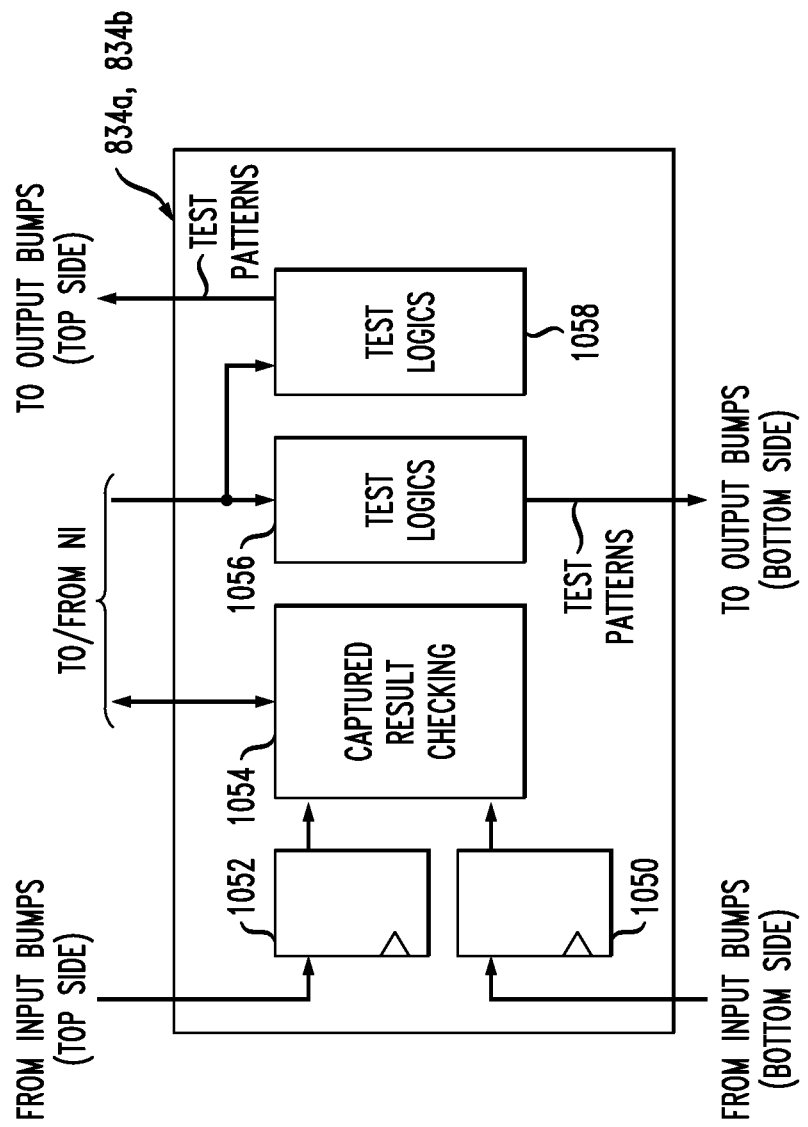

METHOD AND APPARATUS FOR 3D IC TEST

FIELD

The subject matter described herein relates to a test apparatus for a stacked die package.

BACKGROUND

Design-for-Test (DFT) is used throughout the semiconductor industry for digital circuits, using a structural test paradigm. Rather than determine overall functionality of a circuit, structural test determines whether the circuit has been assembled correctly from low-level building blocks as specified in a structural netlist. For example, a DFT test may determine whether all specified logic gates are present, operating correctly, and connected correctly. If the netlist is correct, and structural testing confirms the correct assembly of the circuit elements, then the circuit should function correctly.

IEEE std. 1149.1/4/6 and IEEE std. 1500 are standard serial interfaces for DFT testing. DFT testing requires a long testing time, as large numbers of individual components and nodes are checked. An open circuit in a serial chain will stop further testing.

BRIEF DESCRIPTION OF THE DRAWINGS

FIG. 10B is a block diagraph of the BIST1_1 and BIST2_1 circuit shown in FIG. 8.

DETAILED DESCRIPTION

Figure 1:
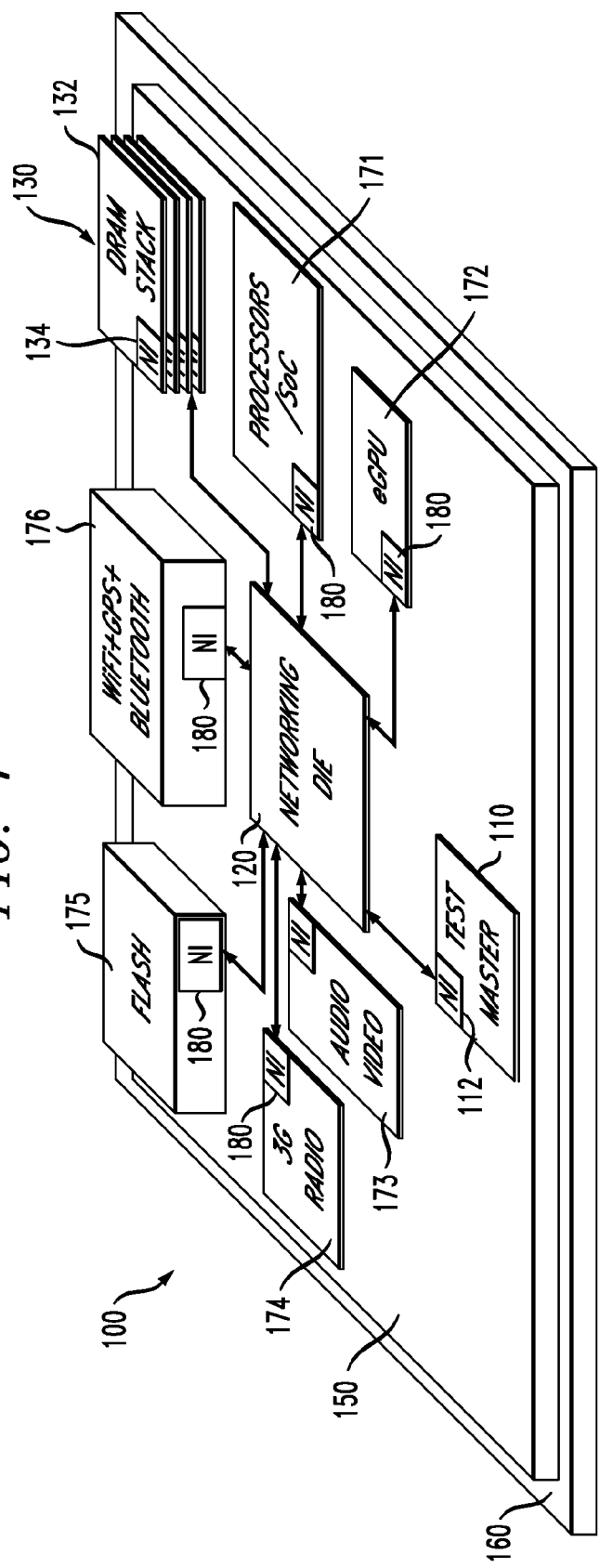
FIG. 1 is an isometric view of an apparatus according to one embodiment.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, unless expressly described otherwise.

In the drawings and the detailed description below, like reference numerals in different denote like elements.

FIG. 1 is a perspective view of one embodiment of an apparatus 100 comprising a plurality of dies suitable for testing using a design-for-testing technique. Apparatus 100 uses a networking structure to perform DFT testing. This structure provides faster testing time, makes it easier to identify failure spots, allows in-circuit testing of the final (end user deliverable) product. Further, some embodiments transfer the system bus interface of each die to a respective network interface within that die, resulting in fewer input/output (I/O) pads for each die.

Figure 3:
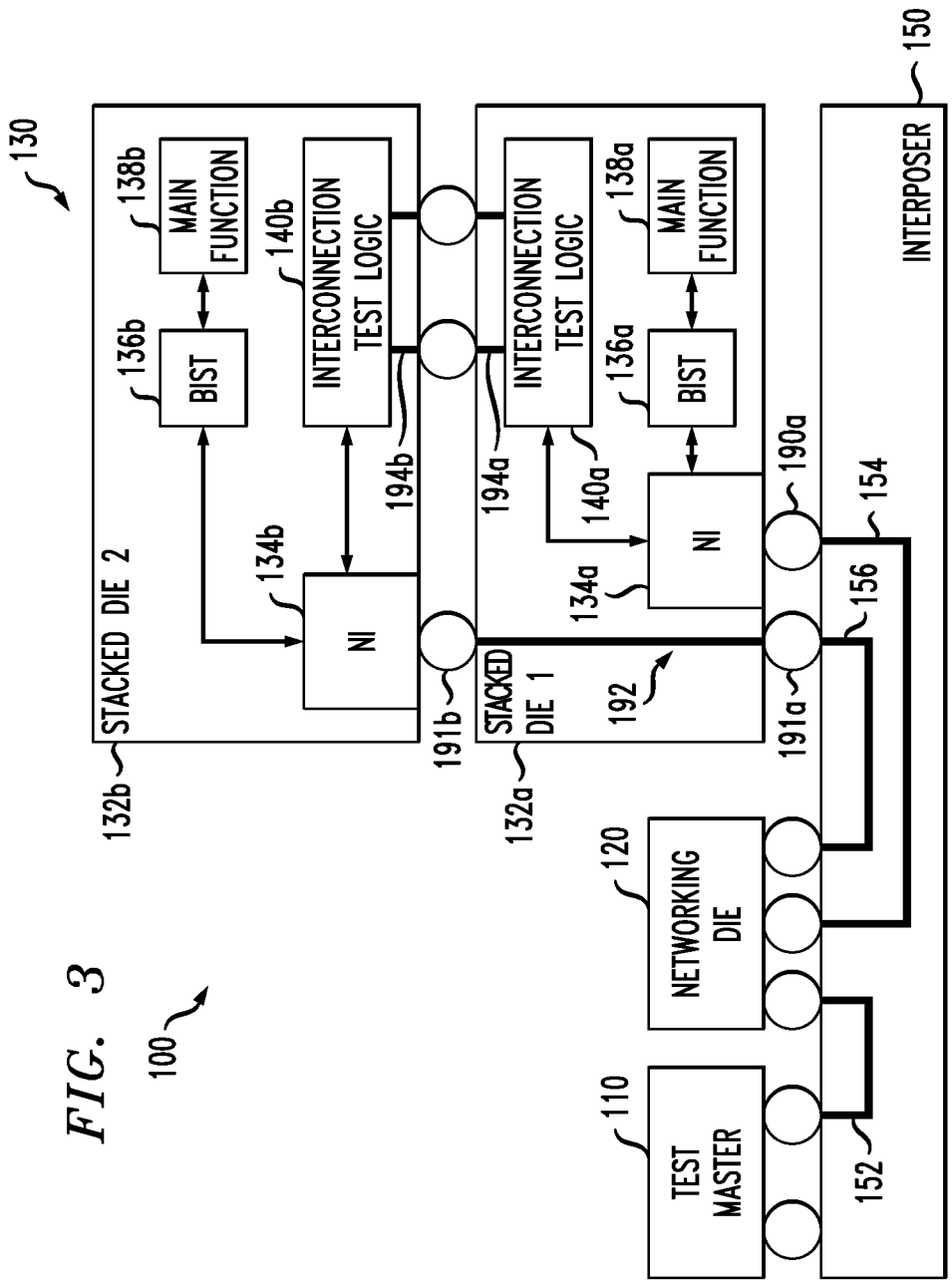
FIG. 3 is a block diagram of the test master, networking die and stacked dies of FIG. 1.

The apparatus includes a interposer 150 having conductive circuit traces (shown in FIG. 3). In some embodiments, the conductive traces are formed in an interposer 150, which may be one of various substrates, rigid or flexible, such as, but not limited to, silicon or FR4 fiberglass reinforced epoxy laminates for a rigid substrate, or polyimide for a flexible substrate.

In other embodiments (not shown), the substrate is a printed circuit board (PCB) 160, which may be formed of a material such as FR4.

A plurality of dies 171-178, 110, 120, 130 are provided over the interposer 150. In the example of FIG. 1, the dies are flip-chip mounted, but in other embodiments (not shown), the dies may be wire bonded. A variety of die types may be included, depending on the type of apparatus 100 and functions performed by the apparatus. For example, the apparatus 100 may be the main board of a laptop computer, a tablet computer, a smart phone, an audio/video player, a cellular phone, a video game console, a television, a radio, or other electronic device. In the example of FIG. 1, the functional dies 171-178 include a general purpose processor (e.g., a system on chip or SoC) 171, a graphics processor 172, an audio/video processor 173, a digital radio receiver 174, a flash memory (or other solid state memory) 175, a communications processor 176 (which may include a WiFi (802.11) interface, a global positioning satellite (GPS) receiver, a Bluetooth interface, or other communications interface used by the apparatus 100; a second processor 177 and a power management unit 178 (shown in FIG. 2). These dies 171-178 are only listed as examples, and are not exclusive of other types of dies.

The apparatus 100 includes a stack 130 including a plurality of stacked dies 132. In the example, each stacked die 132 is a dynamic random access memory (DRAM) package, but in other embodiments, other types of dies may be included in the stack.

A test master 110 is provided for controlling the execution of tests, including scan chain tests for the various components of the apparatus 100. In the example of FIG. 1, the test master 110 is embodied in a separate die. In other embodiments, the test master may provided by processor 171 executing a software application stored in the flash memory 175, or executing a program stored in a read-only memory (ROM), not shown. Test Master 110 can be controlled by CPU 171, by an internal finite state machine (FSM) or by external control pins (e.g.

JTAG interface). In other embodiments, the Test Master logic could be merged into other dies, such as "Processor/SoC" die 171.

Figure 2:
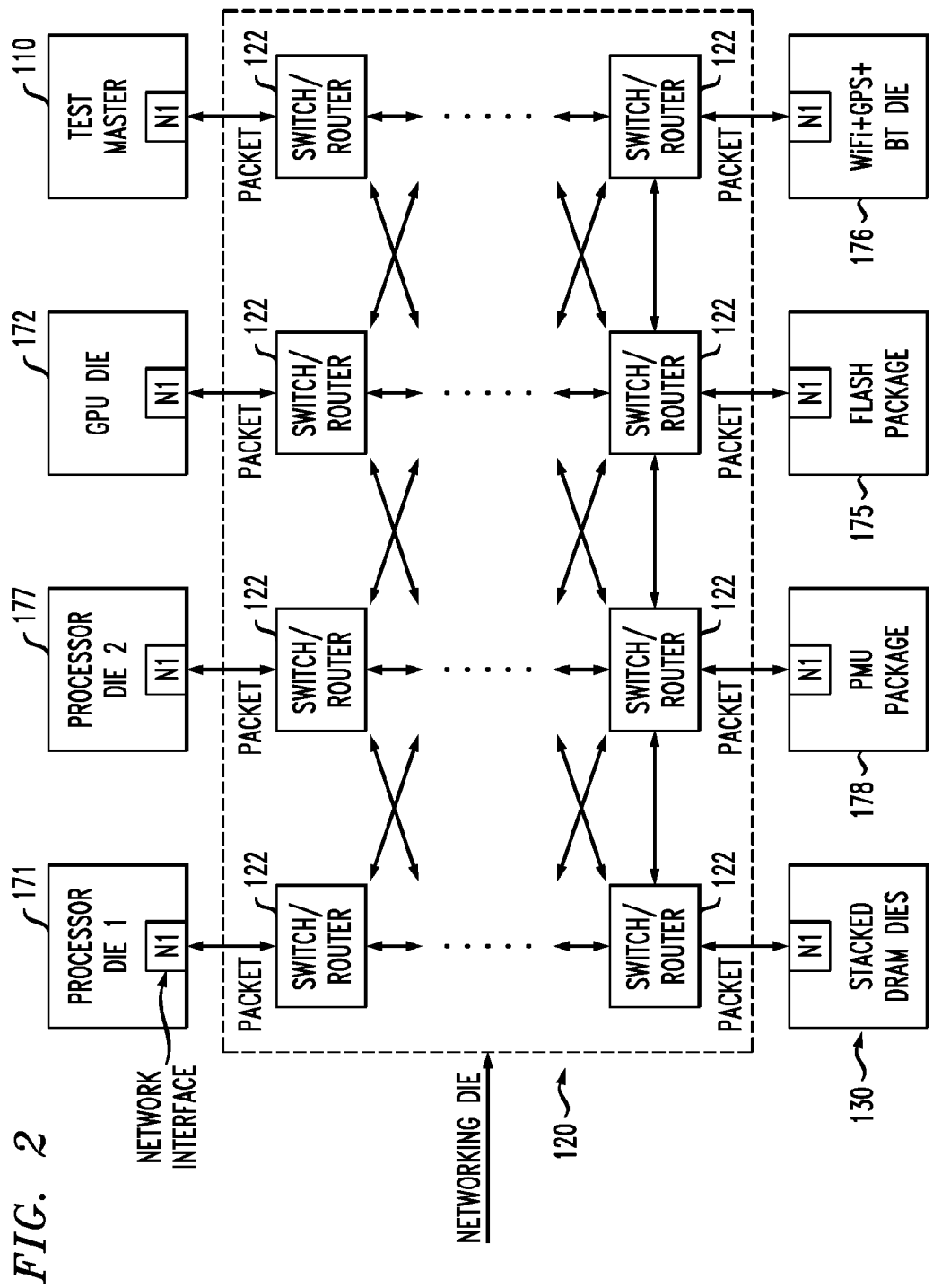
FIG. 2 is a block diagram of the networking die of FIG. 1.

All of the dies 110, 132, 171-176 are coupled to an on-board network. In the example of FIG. 1, the on-board network is provided by a networking die 120. As shown in FIGS. 1 and 2, each of the connected dies 110, 132, 171-176 has a respective network interface (NI) 112, 134, 180 for communicating with the networking die 120. The networking die 120 and network interfaces 112, 134, 180 allow the test master 110 to communicate with each of the dies 132, 171-176 by addressed packets which allow distinct identification of the source of each packet and permits the test master to issue in rapid succession a series of commands to initiate scan chain tests in each die 132, 171-176. Once they receive the commands, the individual dies 132, 171-176 can perform the tests at the same time, without waiting for testing to complete in the other dies. There is no need for the test master 110 to wait for completion of testing in a first die before issuing the command to initiate testing in the second die.

For purposes of simplifying this example, the discussion of FIGS. 3-8 below focuses on two of the stacked dies 132. Nevertheless, any number of stacked dies supported by the fabrication and packaging technology may be used. For example, FIG. 1 shows 4 stacked dies 132, each having a respective network interface 134. The structure of the second die 132b (shown in FIG. 3) can readily be extended to additional dies mounted above die 132b.

Further, as shown in FIG. 2, the networking die 120 includes a respective switch/router circuit 122 corresponding to each respective die 110, 132, 171-178. In some embodiments, there is a respective switch/router circuit 122 corresponding to each stacked DRAM die 132 within the stack 130 (i.e., 4 total for the die stack 130 in FIG. 1). The switch/router design may be, for example, of a type described with reference to FIG. 4 of U.S. Pat. No. 7,826,460 to Lee, which patent is incorporated by reference herein in its entirety. Other switch/router designs may be used to route packets and provide any-to-any connectivity. The various dies 110, 132, 171-178 communicate with each by arranging the data in packets for transmission. Each packet may have a packet header such as that shown in FIG. 3 of U.S. Pat. No. 7,522,538, which patent is incorporated by reference herein in its entirety.

FIG. 3 is a schematic diagram showing a portion of the apparatus 100 of FIG. 1. Other items shown in FIG. 1 are omitted from FIG. 3 for ease of viewing. FIG. 3 shows the test master 110, networking die 120, and stack 130, which comprises a plurality of stacked DRAM dies 132. For ease of description, components of the first die 132a are labeled with the subscript "a," and components of the second die 132b are labeled with the subscript "b". The apparatus 100 includes a first die 132a mounted over the interposer 150, and a second die 132b mounted over the first die 132a and electrically connected thereto. Each of the first die 132a and the second die 132b has a respective network interface 134a, 134b, and a respective interconnection test logic 140a, 140b for configuring interconnections between adjacent dies.

The test master 110 has a command interface coupled to the respective network interface of each of the first die 132a and second die 132b via the conductive traces 152, 154, 156 of the interposer 150. The network interface 134a, 134b of each of the first and second dies 132a, 132b has a respective data interface (FIG. 4) with the interconnection test logic 140a, 140b of that die.

The various dies 110, 132a and 132b are connected to the networking die 120 by conductive traces 152, 154, 156 of the interposer, which may be interposer 150. The active surface of each die has a plurality of conductive solder balls or bumps 190a, 191a on the active face of the die. The solder balls 190a are reflowed to form electrical and mechanical connections. Although FIG. 3 only shows 2-3 solder bumps per die 110, 120, 132a, 132b, it is understood that this is for ease of illustration, and any number of solder bumps may be used.

Each die 132a, 132b has a main function block 138a, 138b which performs the operational function of the die during normal end user operation (i.e., the normal end use tasks for which the die is especially made, excluding the DFT testing of the connectivity of the dies). For example, in the case of DRAMs 132a, 132b, the main function 138a, 138b includes the memory array and associated addressing circuitry.

Each die 132a, 132b may also have a respective built-in-self-test (BIST) block 136a, 136b specially designed to perform a predetermined sequence of tests on the circuitry of the respective main function blocks 138a, 138b.

Each die 132a, 132b further includes a respective interconnection test logic block 140a, 140b, permitting the checking of the interconnections between the stacked dies. In the embodiment of FIG. 3, there are two general types of connections test.

The first type of connection test checks the connections between the networking die 120 and the individual network interfaces (NI) 134a, 134b in each stacked die 132a, 132b. This type of test is referred to herein as an "infrastructure check". The infrastructure check verifies the integrity of the control paths used to transmit commands from the test master 110 to the individual NI's 134a, 134b, and to return test packets (e.g., "ready packets") from each individual stacked die 132a, 132b to the test master 110. In the case of the first stacked die 132a, the tested interconnections include the bump between networking die 120 and interposer 150, conductive trace 154, the bumps 190a, and metal/TSV between NI 134a and the bump 190a. In the case of the second stacked die 132b, the infrastructure check verifies the command path to NI 134b, which includes the bump between networking die 120 and interposer 150, conductive trace 156, bumps 191a, 191b of both dies 132a, 132b respectively, and a connecting path 192, which may be a through-substrate-via or through-silicon-via (TSV) or metals, and metal/TSV between NI 134b and the bump 191b.

The second type of connection test checks the data paths from the adjacent stacked dies above and below each respective stacked die. The data paths are used to transmit data during normal operations. This type of connection test is described below with reference to FIGS. 4, 5, 6.

Figure 4:
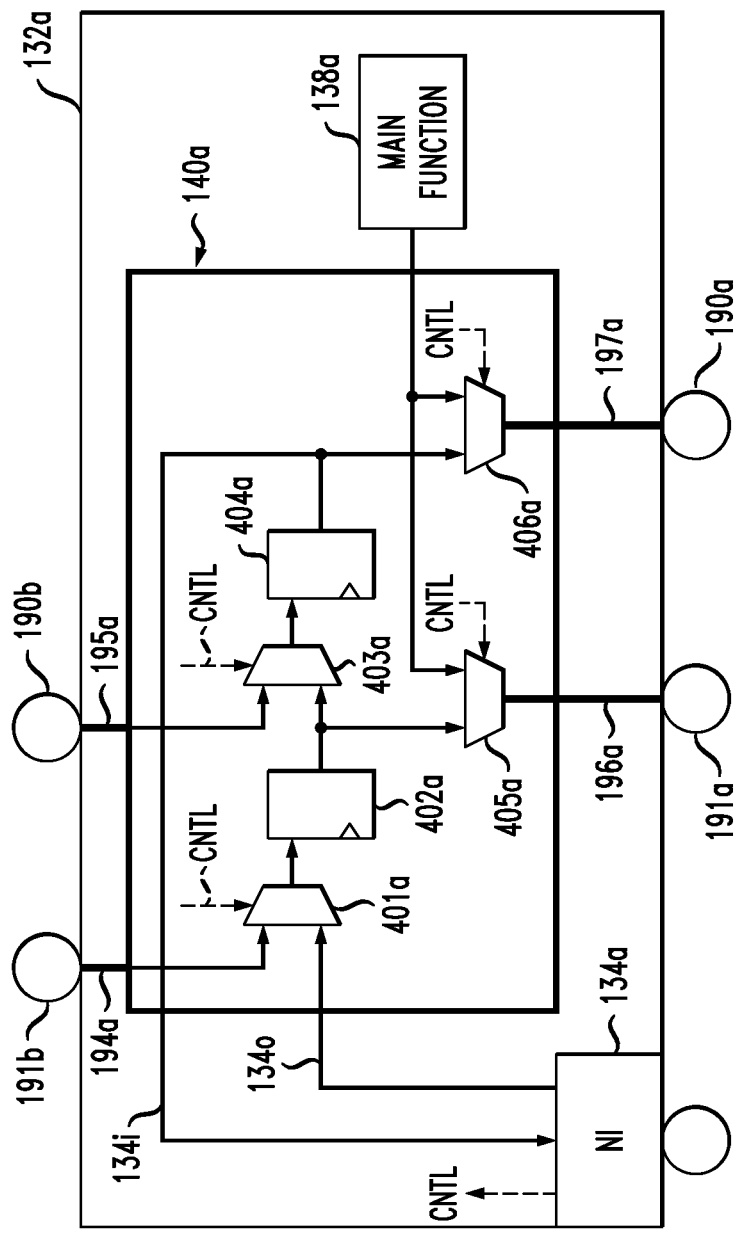
FIG. 4 is a block diagram of the first stacked die of FIG. 3.

FIG. 4 shows one of the stacked dies 132a in greater detail. The other stacked dies 132 (FIG. 1) above die 132a are similar in structure. In FIG. 4, the interconnection test logic 140a and its data path interconnections 190a, 191a, 194a-197a, 190b and 191b are shown in greater detail. For ease of viewing, some components of the die 132a are omitted from FIG. 4. For example, a first mux control signal line CNTL in FIG. 4 connects NI 134a to multiplexers 401a and 403a to control switching of the multiplexers 401a, 403a. A second mux control signal line CNTL connects NI 134a to multiplexers 405a and 406a to control switching of the multiplexers 405a, 406a. These mux control signal lines CNTL are only partially shown in phantom in FIG. 4. The NI 134a is configured so that the polarity of the second mux control signal at any given time is controlled independently of the polarity of the first mux control signal at the same time.

The interconnection test logic 140a, 140b of each of the first and second dies 132a, 132b (shown in FIGS. 5 and 6) comprises input circuitry 401a, 402a, 403a, 404a for selecting either first data provided by the network interface 134a of that die or second data provided by the respective interconnection test logic of another one of the plurality of dies (e.g., the die 132b above die 132a). NI 134a has an output line 134o connected to an input of mux 401a, for providing a test pattern during the interconnection check. NI 134a also has an input line 134i connected to flip flop 404a, for confirming the integrity of the input circuitry during the interconnection check. When the interconnection check test is being performed, muxes 401a, 403a are controlled to either select the data from NI 134a while testing the connections 190a, 191a, 196a, 197a; or select the data from interconnection test logic 140b while testing connections 190b, 191b, 194a and 195a. The selected data are provided to D flip flops 402a, 404a, or other suitable storage elements.

The network interface of each of the first die 132a and second die 132b has a control circuit path CNTL for providing control signals to each multiplexer 401a, 403a of the respective interconnection test logic 140a, 140b of that die to configure the multiplexer to perform the selecting.

The interconnection test logic 140a of each of the first and second dies 132a, 132b further comprises output circuitry 405a, 406a for outputting either the selected one of the first and second data stored in flip flops 402a, 404a during DFT testing, or third data provided by an operation circuit 138a of that die 132a during functional use of the die in normal operations. For example, the selected one of the first and second data may only be passed by muxes 405a, 406a during factory testing, and the data from main function 138a may be passed by muxes 405a, 406a during use by the end user.

Although FIG. 4 shows the input circuitry and output circuitry as each including two multiplexers corresponding to the two bumps 190a, 191a, input circuitry and output circuitry may each include any number of multiplexers corresponding to the number of bumps to be supported by the interconnection test logic 140a.

Figure 5:
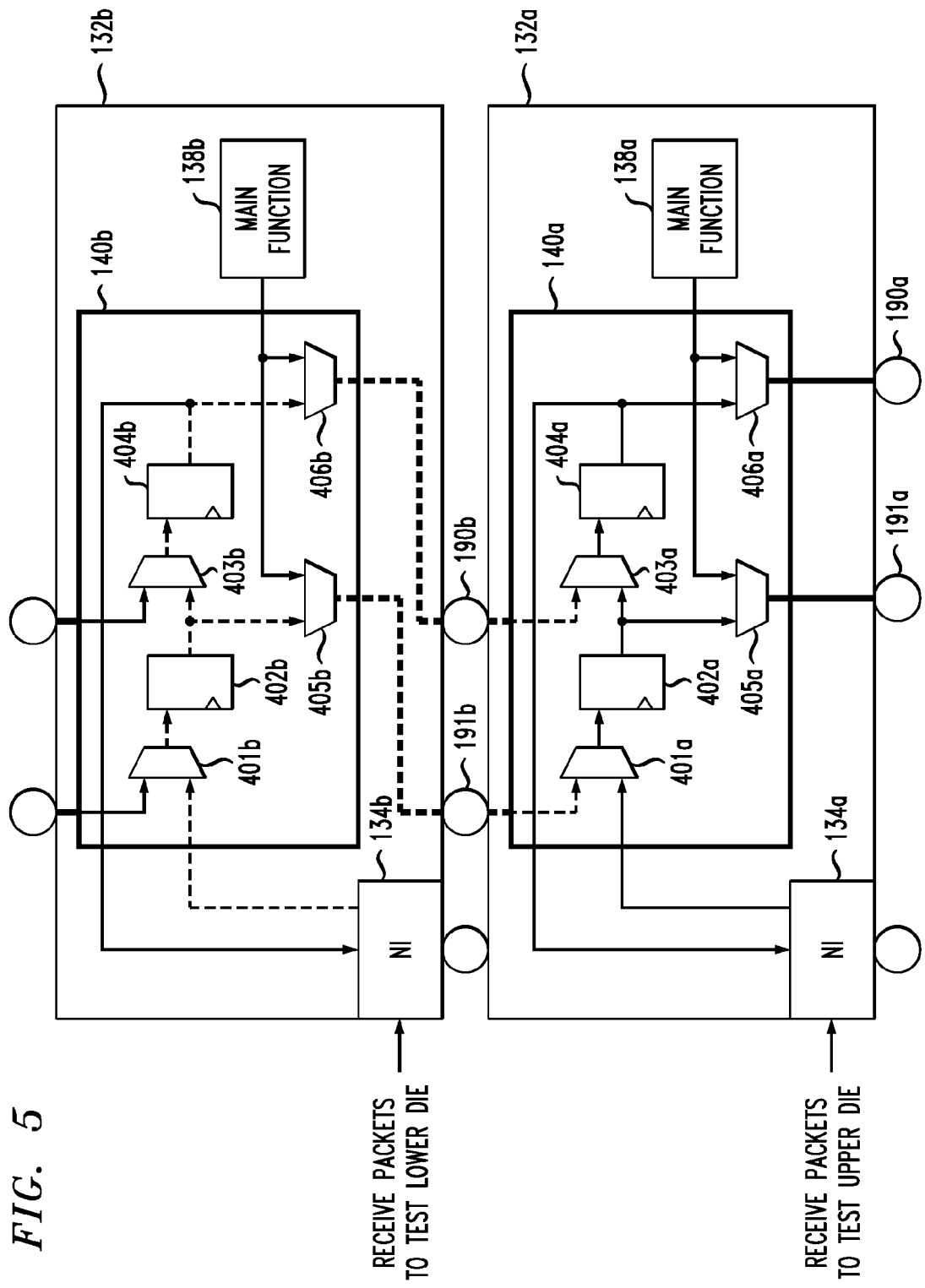
FIG. 5 is a block diagram of the first two stacked dies of FIG. 1 during the first phase of an interconnection test.
Figure 6:
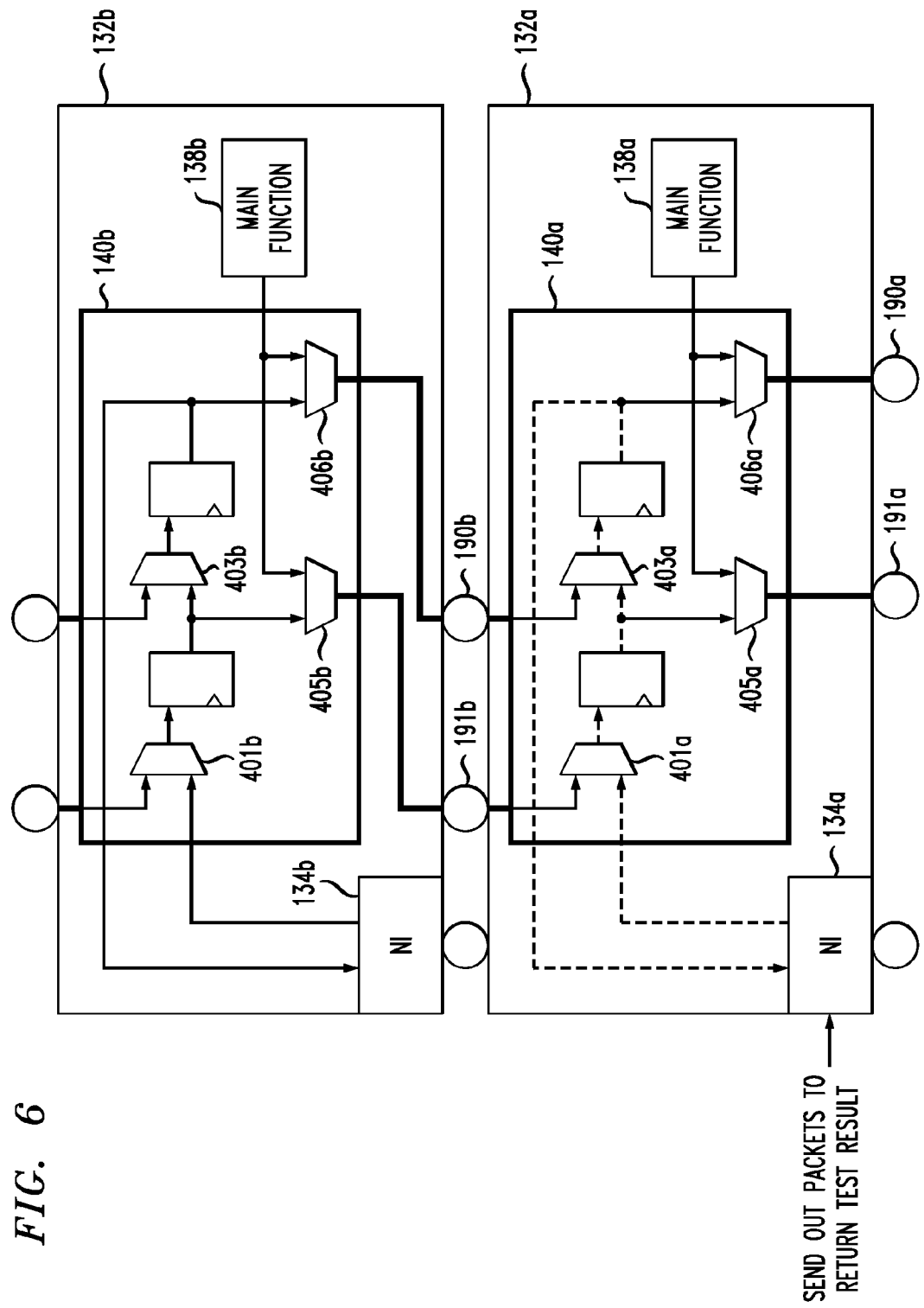
FIG. 6 is a block diagram of the first two stacked dies of FIG. 1 during the second phase of an interconnection test.

FIGS. 5 and 6 show a method of performing the interconnection test described above for the interconnections of the data path. While testing the interconnections corresponding to the second stacked die, the first stacked die is configured by the signals to receive the test data from the second stacked die, and the second stacked die is configured to receive and transmit the test data from the network interface of the second stacked die. Referring first to FIG. 5, when the test master 110 commands network interfaces 134a, 134b to perform the interconnection check, NIs 134a and 134b switch the multiplexers 401a, 403a, 405a, 406a, 401b, 403b, 405b, and 406b, to transmit test patterns across the paths shown in phantom in FIG. 5. Thus, a pattern is transmitted from NI 134b, passes through the interconnection test logic 140b, the bumps 190b, 191b, to the interconnection test logic 140a, and is stored in the D flip flops 402a, 404a. Thus, the only set of bumps in the path include the bumps 190b, 191b between the first stacked die and the second stacked die. By isolating this one set of bumps 190b, 191b between a selected pair of stacked dies 132a, 132b, the integrity of this individual set of connections can be isolated and verified. Referring to FIG. 6, as shown by the path in phantom, the data stored in the flip flops 402a, 404a in FIG. 5 are provided to the NI 134a. NI 134a sends out a packet to return the test result packet to the test master 110. A circuit inside NI 134a (not shown) compares the received test pattern with the expected data and reports the result as "pass" for a match or "fail" if there is no match. In another embodiment, the received test pattern may be sent to test master directly for comparison. In this case, a comparator will be inside test master and compares the received test pattern from NI 134a with expected data to determine if the data path test is passed.

Although FIGS. 5 and 6 only show the configuration of two dies 132a, 132b during the interconnection check, other interconnections (e.g., between a third stacked die and a fourth stacked die) may be tested while dies 132a, 132b are being tested. Thus, if the test master sends commands to the third and fourth stacked dies immediately after sending the command to the first and second stacked dies, the interconnections between the third and fourth dies can be isolated and tested at the same time as the interconnections 190b, 191b.

Figure 7:
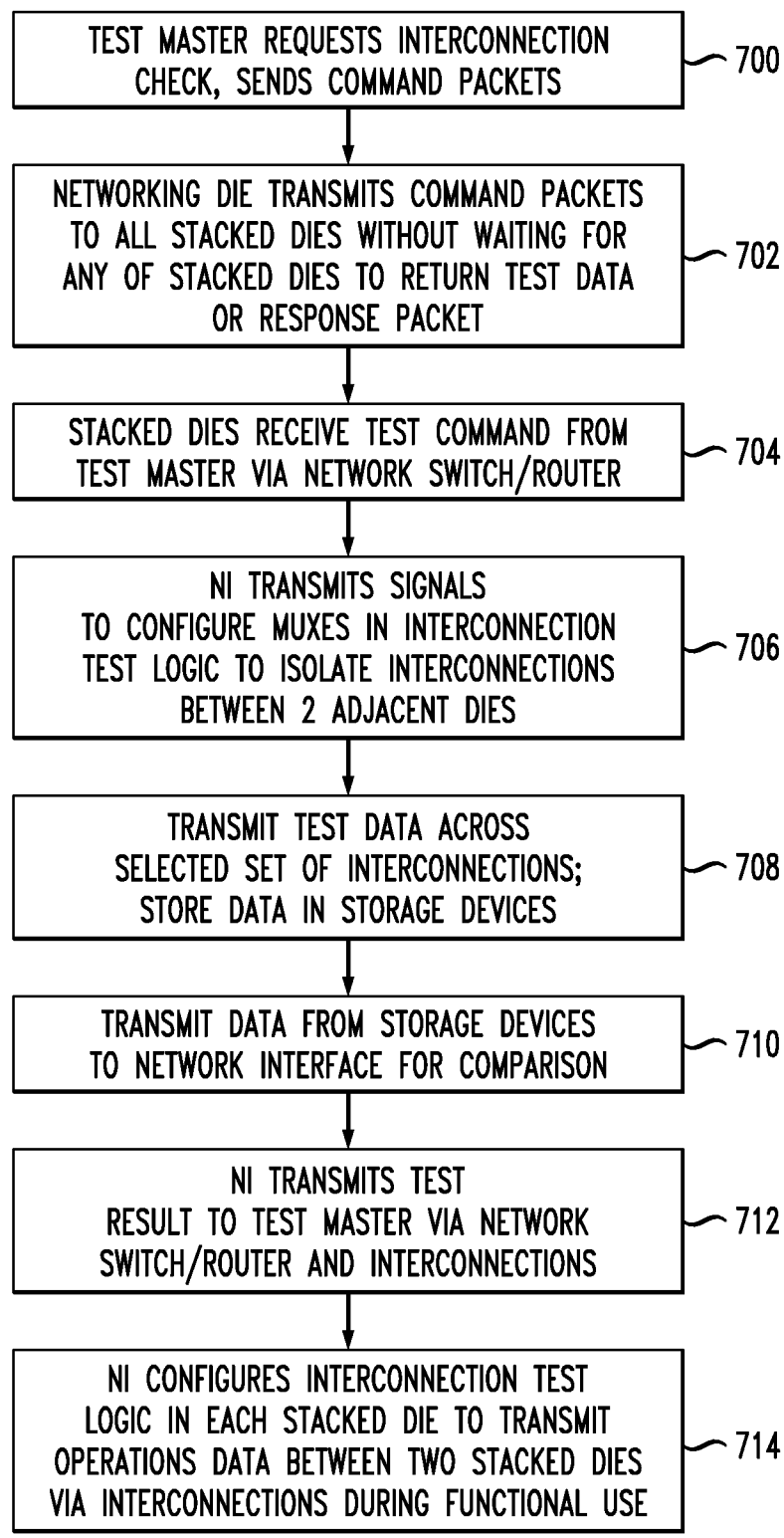
FIG. 7 is a flow chart of the interconnection test shown in FIGS. 5 and 6.

FIG. 7 is a flow chart of a method for performing the interconnection check of the data paths shown in FIGS. 5 and 6. In some embodiments, the test master 110 always initiates the interconnection check for each set of interconnections between each respective pair 132a, 132b of adjacent stacked dies, and between the bottom stacked die 132a and the interposer 150. In other embodiments, the test master 110 only initiates the interconnection check upon detection of an error condition while performing the infrastructure check described below with reference to FIGS. 8-12.

In FIG. 7, at block 700, the test master requests the interconnection check, and sends out command packets.

At step 702, the networking die 120 transmits command packets to the respective network interfaces (NI) in at least two (e.g., all) of the stacked dies 132a, 132b, without waiting for any of the stacked dies to return test data or a response packet.

At step 704, if the interconnections are all sound, the stacked dies receive the test command from the test master via the network switch/router of the networking die 120.

At step 706, the NI 134a, 134b in each die transmits signals for switching an interconnection test logic 140a, 140b in each of at least two stacked dies for transmitting a test data via a path that includes: the interconnections 190a, 191a, 190b, 191b between the two stacked dies 132a, 132b. Thus, each respective stacked die 132a, 132b has respective interconnections 190a, 191a or 191a, 191b configured to carry output signals from the respective interconnection test logic 140a, 140b of that stacked die, such that each adjacent pair of the stacked dies are connected to each other by the interconnections corresponding to one of the adjacent pair of the stacked dies.

At step 708, the test data are transmitted across the selected set of interconnections; and the test data are also stored in storage devices within each interconnection test logic. In some embodiments, the test master 110 generates the test data and transmits it to the stacked dies 132a, 132b via the networking die 120. In some embodiments, the test master commands the networking interface 112 (shown in FIG. 8) of the test master 110 to generate the test data and transmit it to the stacked dies. In other embodiments, the test master commands the networking interface 134a, 134b within each stacked die 132a, 132b to generate the test data and transmit it through the interconnections. In any case, the interconnection check isolates a set of interconnections 190a, 191a, or 190b, 191b, so that any failure to transmit the test data correctly across the interconnections in two or more stacked dies can be traced to a specific interface.

At step 710, the captured test data are stripped out from the storage devices 402a, 404a, 402b and 404b and transmitted to the NI 134a, 134b for comparison with the expected data (which were either generated by the NI 134a in one of the stacked dies in some embodiments, or in other embodiments generated by the NI 112 (shown in FIG. 8) of the test master 110 or the test master 110 itself). The result is either a match (test passed), or no match (test failed).

At step 712, the NI 134*a*, 134*b* transmits the comparison result to the test master 110 via the network switch/router in network die 120.

At step 714, having completed the interconnection check, the NI 134*a*, 134*b* switch the respective interconnection test logic of each stacked die 132*a*, 132*b* to selectively couple the respective interconnections of that die with a respective operations circuit 138*a*, 138*b* in that stacked die for carrying output signals during functional use. The interconnection test logic in each stacked die are selectively configurable to transmit operations data between the two stacked dies via the interconnections during functional use.

Figure 8:
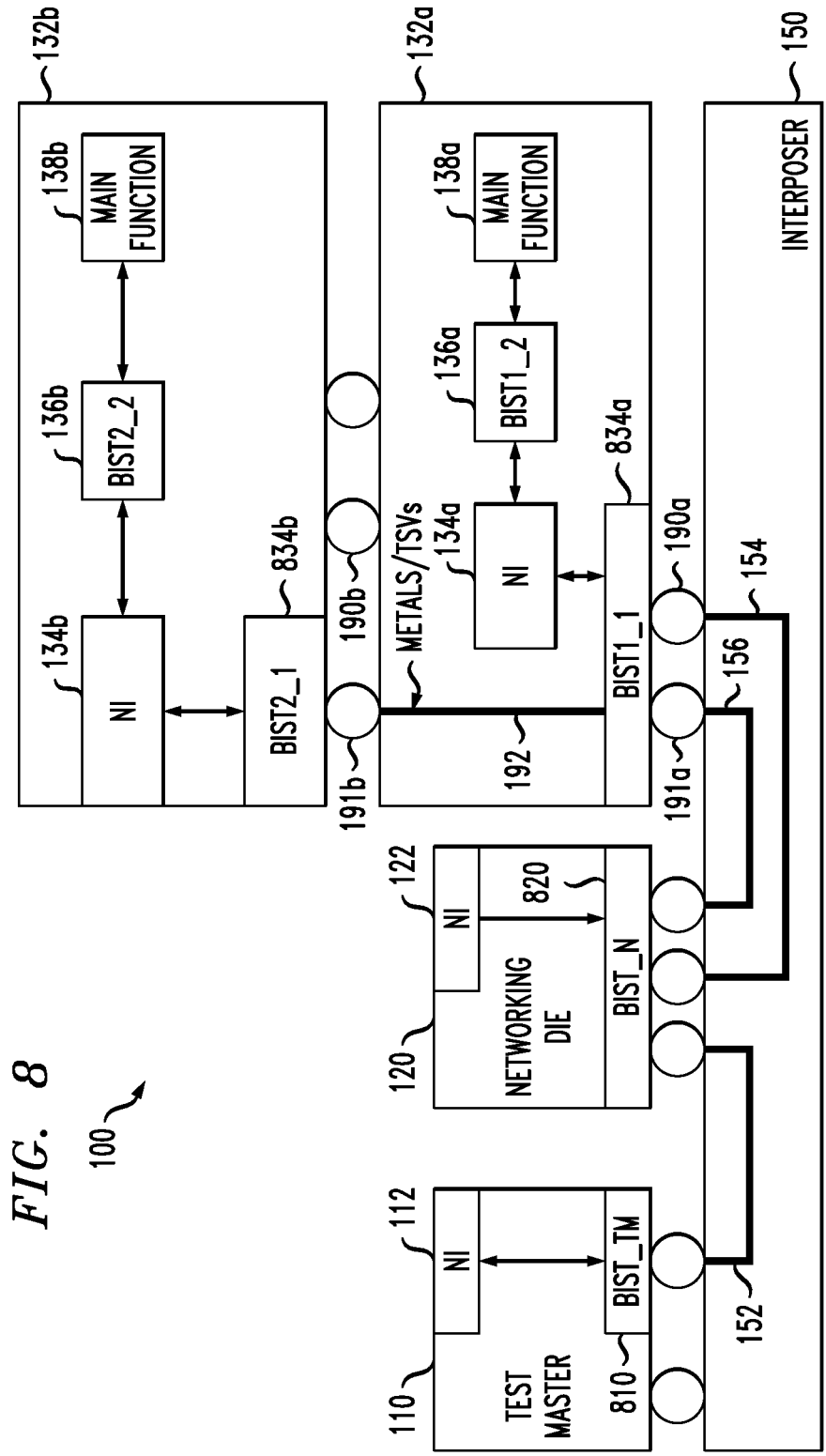
FIG. 8 is a block diagram of the first two stacked dies of FIG. 1 during the an infrastructure test.

FIG. 8 shows additional details of the apparatus 100 as used during the infrastructure test and packet path test. Whereas FIGS. 5-7 above focus on the means and method for checking the integrity of the interconnections 190*a*, 191*a*, 190*b*, 191*b* in the data paths between the stacked dies (and between the bottom die 132*a* and the interposer 150), FIG. 8 shows the means for checking the paths between the networking die 120 and the individual network interfaces 134*a*, 134*b* of each stacked die. It will be understood that other details of the stacked dies (including the data path and the interconnection test logic 140*a*, 140*b*) are omitted from FIG. 8 for ease of understanding, but are included in the apparatus 100.

The infrastructure test (FIG. 8) provides a quick way to make sure if all the networking paths are sound. The test master 110 requests a ready packet from the individual network interface in each function die 171-178, 132. If the requested ready packets are generated and returned by every function die, then all the tested paths are known to be fully operative. If one of the function dies does not return a packet, then there is a failed connection, either in the path from the test master to that function die, or in the return path from that function die to the test master. If a failure is detected, the infrastructure test does not identify the exact failure spots. Thus, the packet path test can be launched to identify the exact failure spots using the circuits shown in FIGS. 9-10B.

In FIG. 8, additional BIST circuits 810, 820, 834*a*, 834*b* is provided in each die. Whereas the BIST circuits 136*a*, 136*b* are provided for testing the function of the operational main function blocks 138*a*, 138*b*, respectively, the additional BIST circuits in FIG. 8 are provided for testing the readiness of packet path interconnections. In each of the dies, the respective NI 112, 122, 134*a*, 134*b* is connected to its external interconnection via a respective BIST circuit. This permits isolation and testing of the control paths used to communicate with each NI.

Figure 9:
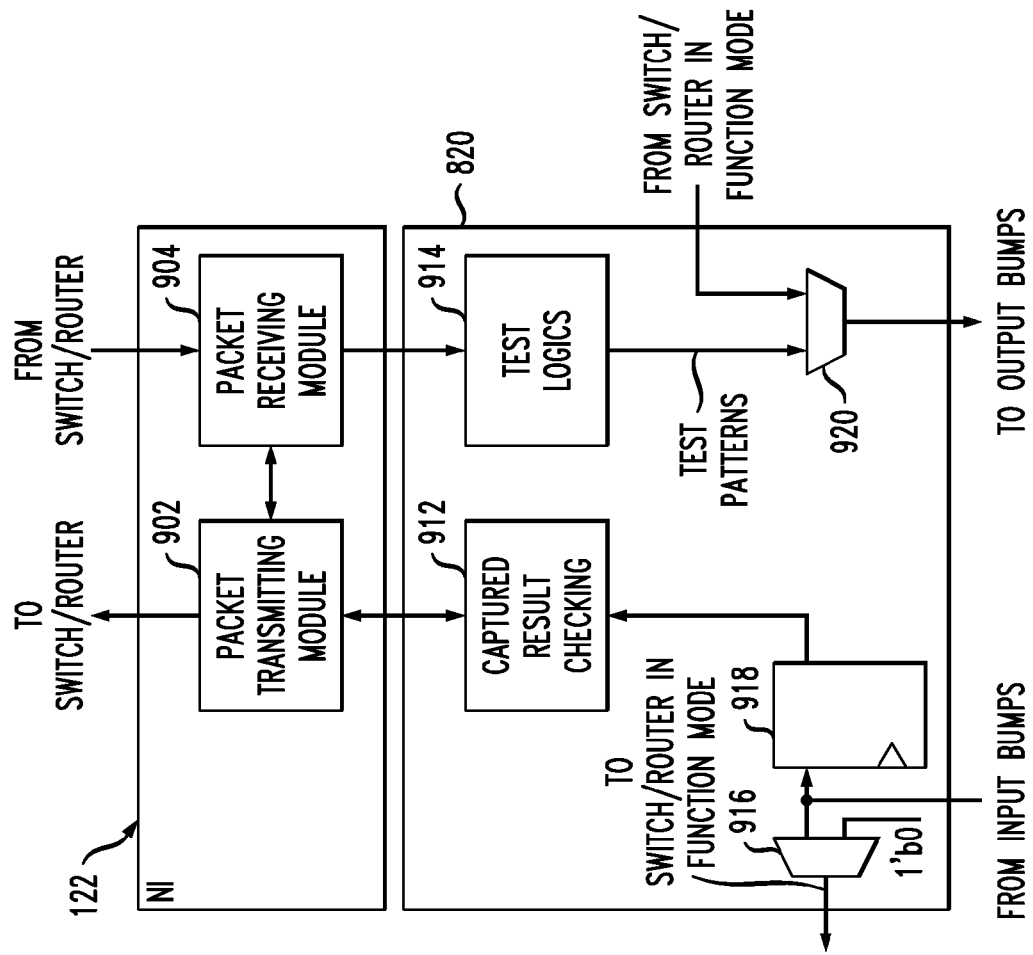
FIG. 9 is a block diagram of the NI and BIST N circuits in the networking die shown in FIG. 8.

FIG. 9 is an expanded detail of FIG. 8, showing the NI 122 and the BIST N circuit 820 of the networking die 120. NI 122 has a packet transmitting module 902 and a packet receiving module 904. Module 902 performs rate matching, buffering, header generation and encoding, and transmission of packets to the switch/router within the NI 180 of one of the dies 171-178 or within NI 134 of DRAMs 132. Module 904 receives packets from the switch/router within the NI 180 of one of the dies 171-178 or within NI 134 of DRAMs 132, performs rate matching, buffering, header decoding and stripping, and forwards the received packets to module 902 (for retransmission to another die) or to BIST 820 during testing.

The BIST N block 820 has a control interface from NI 122 of networking die. The NI 122 of networking die provides a switching signal to the multiplexer 916 for initiating the packet path test. Mux 916 receives inputs from the input bumps of networking die 120 and, while operating in normal function mode, outputs to the switch/router within networking die 120. When the multiplexer 916 is set to perform the packet path test, the data received from BIST1_1 834*a* of die 132*a* or BIST_TM 810 will be stored in flip flop 918 for comparison (in captured result checking block 912) with the expected data from NI 122. The captured result checking block 912 has one or more comparators for determining whether the captured result matches the expected result.

The BIST N block 820 also has a multiplexer 920 for selecting either test data from test logic 914 in packet path test or packet data from switch/router within networking die 120 in function mode. The test logic 914 generates a test data to test the path from BIST_N 820 to the BIST circuit 834*a* die 132*a* or the path from BIST_N 820 to BIST_TM 810. The outputs from multiplexer 920 are provided to the output bumps of networking die 120.

Figure 10A:
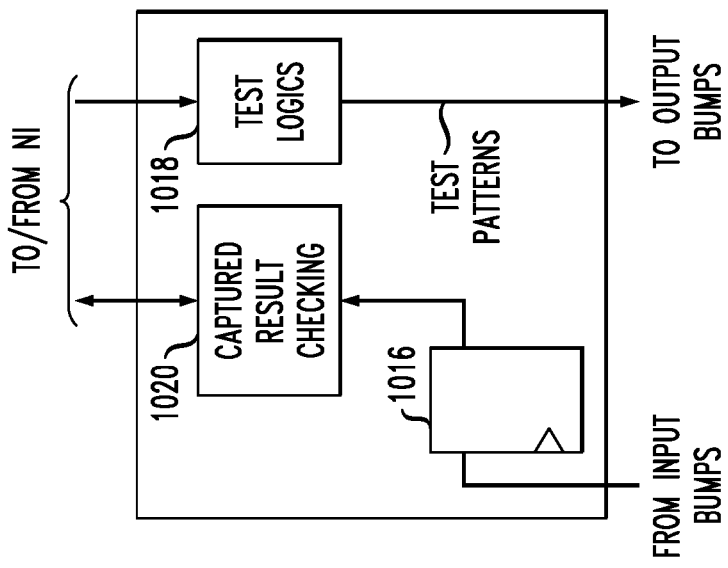
FIG. 10A is a block diagram of the BIST_TM circuit shown in FIG. 8.

FIG. 10A is a detailed diagram of the BIST_TM circuit 810 (FIG. 8) of test master 110. BIST_TM 810 has test logic 1018 for generating a test pattern that is output to the bumps of test master 110 and through the conductive path 152 of interposer 150 to BIST_N 820 of networking die 120. BIST_TM 810 also has a D flip flop for capturing the received test result from the input bumps of test master 810 (which is further from BIST_N 820 of networking die 120), and a captured result checking block 1020 for comparing the received pattern to the expected pattern. If all paths and connections are correct, then the received pattern matches the expected pattern.

FIG. 10B is a block diagram of an example of the BIST1_1 and BIST2_1 circuits 834*a*, 834*b* (shown in FIG. 8) in the stacked dies 132*a*, 132*b*. For ease of explanation, the example of this block diagram is described with reference to the BIST1_1 circuit 834*a*. The BIST1_1 circuit 834*a* has an input flip flop 1050 for receiving test pattern from BIST_N 820, through the bottom side input bumps and a top side input flip flop 1052 for receiving test pattern from BIST2_1 834*b*, through the top side input bumps. The captured result checking block 1054 performs a comparison of a test patterns received from BIST_N 820 and BIST2_1 834*b* against a expected data. The result is then output to the NI 134*a*. Test logic blocks 1056 and 1058 receive commands by way of the NI 120, and output test patterns to the output bumps at the bottom and top faces of the die 132*a* to BIST_n 820 and BIST2_1 834*b* respectively The BIST2_1 block 834*b* and the corresponding BIST blocks in any additional stacked dies are configured similarly, except the BIST4_1 circuit for the top die in the stack does not receive inputs from topside bumps.

Figure 11:
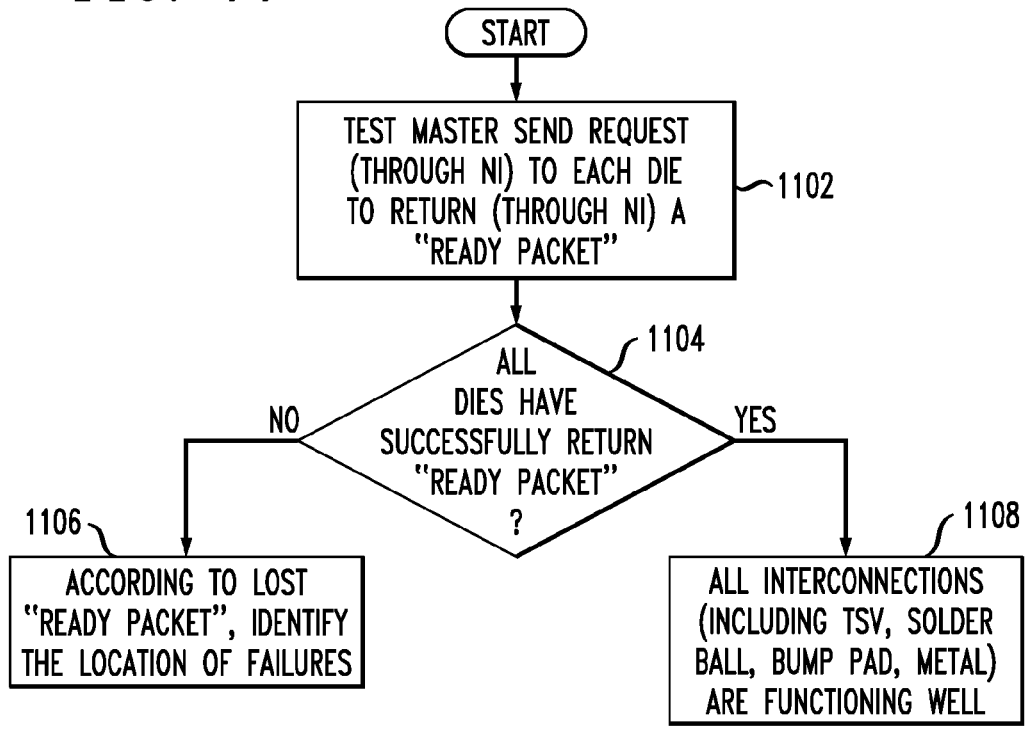
FIG. 11 is a high level flow chart of the infrastructure test of FIGS. 8-10.

FIG. 11 is a high level flow chart of the infrastructure test performed by the apparatus of FIG. 8. In some embodiments. the infrastructure test is performed before any interconnection tests are performed.

At step 1102, the test master 110 sends a request to each die 132*a*, 132*b* (via the networking die 120). The request instructs each die 132*a*, 134*a* to return a "ready" packet. The request is sent to the respective NI 134*a*, 134*b* of each respective die 132*a*, 132*b*, by way of the interfaces shown in FIGS. 8-10B.

In response to the request, the NI 134*a*, 134*b* of each stacked die 132*a*, 132*b* generates a "ready" packet. The ready packet may contain any predetermined data or sequence of data to be sent in response to this request. The ready packets are individually sent to the test master by way of the interconnections as shown in FIG. 8

At step 1104, the test master 110 determines whether all dies have successfully returned the "ready" packet containing the correct expected data. If all are successfully received, step 1108 is performed. If one or more of the dies 132*a*, 132*b* fail to successfully return the "ready" packet, step 1106 is performed.

At step 1106, if no packet has been received from a specific die, the location of the failures can be determined. For example, if the ready packet is returned by first die 132a, but not second die 132b, then the interconnections between networking die 120 and die 132b are likely the source of the failure. The packet path test discussed above with reference to FIGS. 8-10B can then be performed to specifically determine the failure spots.

At step 1108, if all the ready packets are returned then the test master 110 determines that all of the control interconnections are functioning well. This includes TSVs, solder balls, bumps, pads, and conductive (e.g., in-plane metal) circuit traces that are used to deliver packets.

Figure 12:
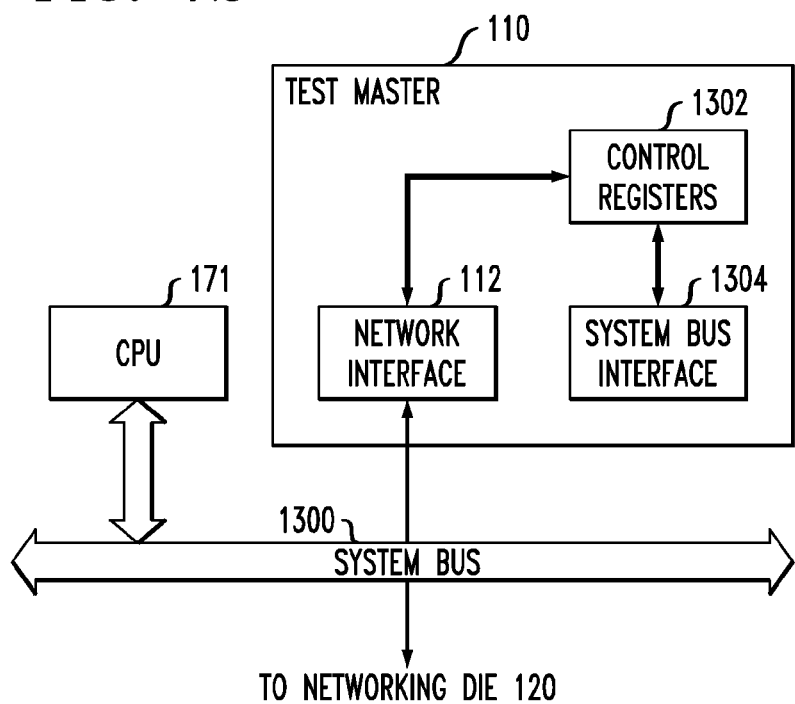
FIG. 12 is a block diagram of a first embodiment of the test master shown in FIG. 1.
Figure 13:
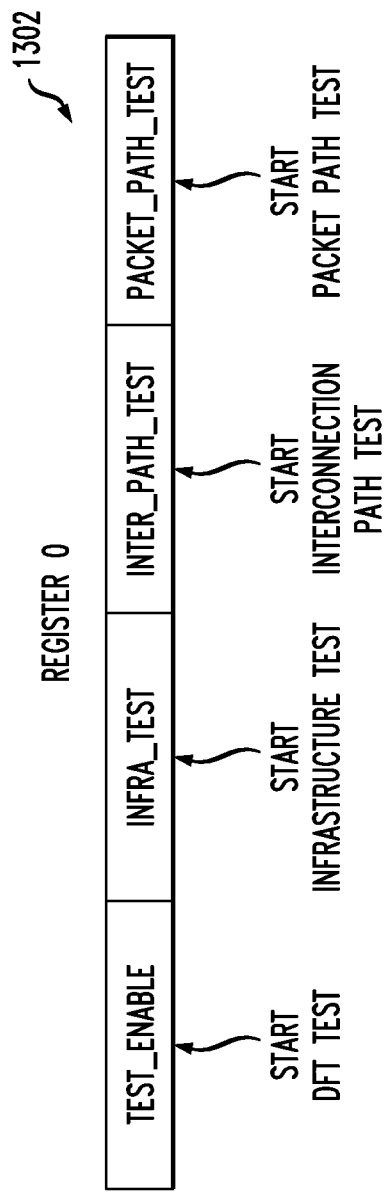
FIGS. 13 and 14 are diagrams of the contents of the control registers shown in FIG. 13.
Figure 14:
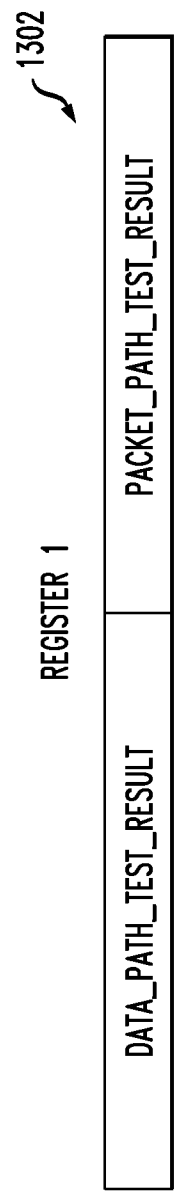

FIG. 12 is a block diagram of an embodiment of the test master 110. In the embodiment of FIG. 12, test master 110 is controlled by a CPU, such as processor 171. The CPU write commands into control registers 1302. The network interface 112 will issue corresponding packets according to the commands in control registers 1302. The CPU 171 will then read out test results saved in control registers FIGS. 13 and 14 show an example of a set of control registers suitable for use in the test master of FIG. 12. Register 0 (FIG. 13) is written by the CPU 171 and Register 1 (FIG. 14) is read by the CPU 171. In the example, register 0 includes a "test enable bit" to start design for test (DFT) testing, a "start infrastructure test" bit to initiate the infrastructure test (FIG. 11), an "inter_path test" bit to start the interconnection path test (FIGS. 5-7) and a "start_packet_path_test" bit to start the packet path test (FIGS. 8-10).

FIG. 14 shows register 1, which is read by the CPU 171. One field includes the data_path_test_result, and the other field includes the packet_path_test_result.

The CPU 171 communicates with the control registers 1302 via the system bus 1300 and bus interface 1304.

The network interface 112 reads from register 0 and writes to register 1, and exchanges data with the NI 122 of networking die 120.

Figure 15:
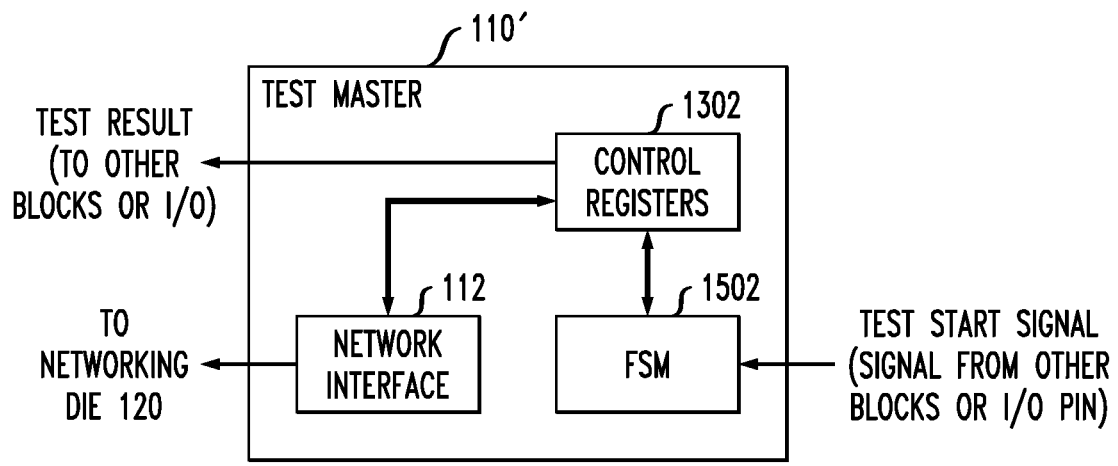
FIG. 15 is a block diagram of a second embodiment of the test master shown in FIG. 1.

FIG. 15 is a block diagram of a second embodiment of the test master 110'. Test master 110' is controlled by a FSM (Finite State Machine) 1502. FSM 1502 writes commands into control registers first. Network Interface 112 will issue corresponding packets according to the commands in control registers 1302. Test results will be saved in control registers 1302 and then sent to other blocks (such as FSM) or I/O. The registers 1302 may be configured as shown in FIGS. 14A and 14B.

Figure 16:
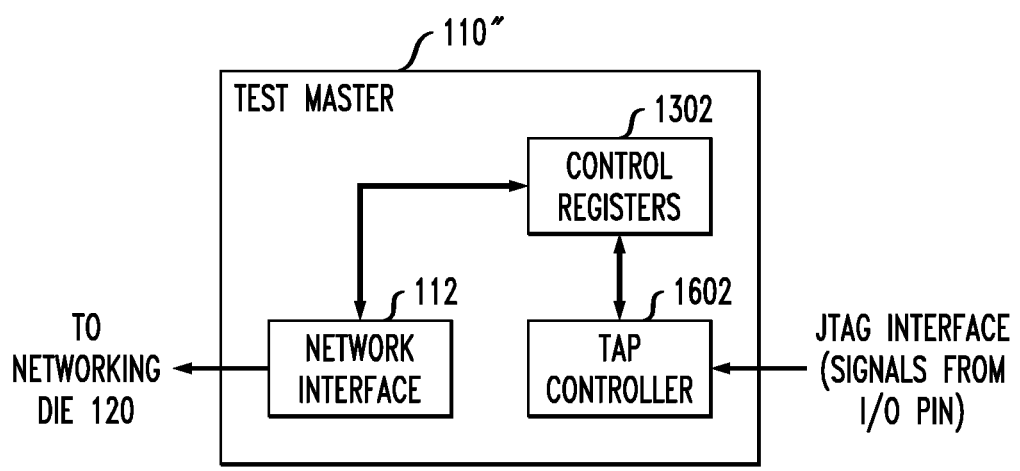
FIG. 16 is a block diagram of a third embodiment of the test master shown in FIG. 1.

FIG. 16 is a block diagram of a third embodiment of the test master 110'. "Test master 110" is controlled by JTAG (IEEE Std. 1149.1) interface tap controller 1602. Commands are written into control registers 1302 thru the JTAG interface. The Network Interface 112 will issue corresponding packets according to the commands in control registers 1302. Test results will be saved in control registers 1302 and read out thru JTAG interface 1602.

Although an example is described above for interconnection testing and infrastructure testing of stacked die structures, the structures and methods described above are also usable testing the dies 171-178. Testing the interconnections of one of the dies 171-178 is performed in manner similar to that used for testing the interconnections of the first die 132a.

In some embodiments, an apparatus comprises a substrate having conductive circuit traces. A plurality of dies include a first die mounted over the substrate, and a second die mounted over the first die and electrically connected thereto. Each of the first die and the second die have a respective network interface, and a respective interconnection test logic for configuring interconnections between adjacent dies. A test master has a command interface coupled to the respective network interface of each of the first and second dies via the conductive traces of the substrate. The network interface of each of the first and second dies has a respective data interface with the interconnection test logic of that die.

In some embodiments, a method comprises: receiving a network interface test packet request from a networking die coupled to a substrate; and causing a network interface built-in-self-test (BIST) circuit in each of at least two stacked dies over the substrate, to transmit a respective network interface test packet from each of the at least two stacked dies, via respective paths. Each path includes: the network interface BIST circuit in at least one of the stacked dies, and at least one respective interconnection intermediate the substrate and the respective network interface BIST circuit in a respective one of the stacked dies.

In some embodiments, a method comprises: receiving a test command packet from a test master via a network switch or router; and transmitting signals for switching an interconnection test logic in each of at least two stacked dies to transmit a test data to the test master via a path. The path includes: the network switch or router, and interconnections between the two stacked dies. The interconnection test logic in each stacked die are selectively configurable to transmit operations data between the two stacked dies via the interconnections during functional use.

In some embodiments, an apparatus comprises a die comprising a plurality of switch/router circuits; and a plurality of additional dies. Each respective one of the plurality of additional dies comprises: a respective network interface, which is electrically coupled to a respective one of the plurality of switch/router circuits; and a respective interconnection test logic, which is electrically coupled to the respective network interface and the interconnection test logic in at least one other one of the plurality of additional dies.

In some embodiments, an apparatus comprises: a first die having a plurality of switch/router circuits; and a plurality of additional dies. Each respective one of the plurality of additional dies comprises: a respective network interface, which is electrically coupled to a respective one of the plurality of switch/router circuits; and a respective built in self test (BIST) circuit, which is electrically coupled to the respective network interface and the BIST circuit of another one of the plurality of additional dies.

In some embodiments, an apparatus comprises: a plurality of switch/router circuits; a test master which is electrically coupled to one of the plurality of switch/router circuits; and a plurality of dies. Each of the plurality of dies comprises a respective network interface, which is electrically coupled to a respective one of the plurality of switch/router circuits.

Although the subject matter has been described in terms of exemplary embodiments, it is not limited thereto. Rather, the appended claims should be construed broadly, to include other variants and embodiments, which may be made by those skilled in the art.

What is claimed is:
1. Apparatus comprising:
a die comprising a plurality of switch/router circuits; and
a plurality of additional dies, each respective one of the plurality of additional dies comprising:
a respective network interface, which is electrically coupled to a respective one of the plurality of switch/router circuits; and
a respective interconnection test logic, which is electrically coupled to the respective network interface and the interconnection test logic in at least one other one of the plurality of additional dies, wherein the interconnection test logic of a first one of the plurality of additional dies is configured for selecting and outputting a test pattern for testing an inter-die connection of the first one of the plurality of additional dies.

2. The apparatus of claim 1, further comprising a test master that is electrically coupled to one of the plurality of switch/router circuits.

3. The apparatus of claim 1, wherein the plurality of additional dies are stacked over an interposer.

4. The apparatus of claim 1, wherein the interconnection test logic in a second one of the plurality of additional dies is configured for receiving the test pattern for testing the inter-die connection.

5. The apparatus of claim 4, wherein the network interface in the second additional die is configured to check the received test pattern.

6. The apparatus of claim 4, further comprising a test master that is electrically coupled to one of the plurality of switch/router circuits, wherein the test master is configured to check the received test pattern.

7. Apparatus comprising:
a first die having a plurality of switch/router circuits having any-to-any connectivity with each other; and
a plurality of additional dies, each respective one of the plurality of additional dies comprising:
a respective network interface, which is electrically coupled to a respective one of the plurality of switch/router circuits; and
a respective built in self test (BIST) circuit, which is electrically coupled to the respective network interface and the BIST circuit of another one of the plurality of additional dies.

8. The apparatus of claim 7, further comprising a test master that is electrically coupled to one of the plurality of switch/router circuits.

9. The apparatus of claim 7, wherein the plurality of dies are stacked on an interposer.

10. The apparatus of claim 7, wherein the BIST circuit of a first one of the additional dies is configured for generating a test pattern, and the BIST circuit of a second one of the plurality of additional dies is configured for receiving and checking the test pattern.

11. The apparatus of claim 7, wherein the BIST circuit of a first one of the additional dies is configured for generating a test pattern, and the BIST circuit of a second one of the plurality of additional dies is configured to receive the test pattern, further comprising a test master configured for checking the test pattern.

12. Apparatus comprising:
a plurality of switch/router circuits;
a test master which is electrically coupled to one of the plurality of switch/router circuits; and
a plurality of dies including a first die, each of the plurality of dies comprising:
a respective network interface, which is electrically coupled to a respective one of the plurality of switch/router circuits, and
a respective interconnection test logic, which is electrically coupled to the respective network interface of that die and to the respective interconnection test logic of another one of the plurality of dies,
wherein the interconnection test logic of the first die is configured for selecting and outputting a test pattern for testing an inter-die connection of the first die.

13. The apparatus of claim 12, wherein the plurality of dies are stacked over an interposer.

14. The apparatus of claim 12, wherein the interconnection test logic of a second one of the plurality of dies is configured for receiving the test pattern for testing the inter-die connection.

15. The apparatus of claim 14, wherein the network interface of the second die is configured for checking the received test pattern.

16. The apparatus of claim 14, wherein the test master is configured for checking the received test pattern.

17. The apparatus of claim 12, wherein each of the plurality of dies further comprises a respective built in self test (BIST) circuit, which is electrically coupled to the respective network interface of that die and to the BIST circuit of at least one other one of the plurality of dies.

18. The apparatus of claim 17, wherein the BIST circuit of a first one of the plurality of dies is configured to generate a test pattern, and the BIST circuit of a second one of the plurality of dies is configured to receive and check the test pattern.

19. The apparatus of claim 17, wherein the BIST circuit of a first one of the plurality of dies is configured to generate a test pattern, and the BIST circuit of a second one of the plurality of dies is configured to, receive the test pattern, and the test master is configured to check the test pattern.

20. The apparatus of claim 1, wherein the respective network interface in at least one of the additional dies is electrically directly connected by a conductive path to a respective one of the plurality of switch/router circuits.

* * * * *